(12) United States Patent
Printy et al.

(10) Patent No.: US 7,829,429 B1
(45) Date of Patent: Nov. 9, 2010

(54) SEMICONDUCTOR DEVICE HAVING LOCALIZED INSULATED BLOCK IN BULK SUBSTRATE AND RELATED METHOD

(75) Inventors: Craig Printy, Buxton, ME (US); Andre P. Labonte, Scarborough, ME (US); Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 331 days.

(21) Appl. No.: 11/901,688

(22) Filed: Sep. 18, 2007

(51) Int. Cl.
*H01L 21/76* (2006.01)
*H01L 29/00* (2006.01)
(52) U.S. Cl. .................. 438/400; 438/424; 257/706; 257/506; 257/E21.546
(58) Field of Classification Search ............. 438/400, 438/411, 412, 421, 424; 257/706, 508, 506, 257/E21.546
See application file for complete search history.

(56) References Cited

U.S. PATENT DOCUMENTS

| | | | |
|---|---|---|---|
| 6,800,518 B2 | 10/2004 | Bendernagel et al. | |
| 6,818,528 B2 * | 11/2004 | Mandelman et al. | 438/427 |
| 7,015,147 B2 * | 3/2006 | Lee et al. | 438/734 |
| 7,018,882 B2 | 3/2006 | Tweet et al. | |
| 7,078,298 B2 | 7/2006 | Lee et al. | |
| 7,452,784 B2 * | 11/2008 | Henson et al. | 438/421 |

OTHER PUBLICATIONS http://legwww.epfl.ch/leg2/cours_nano_06/Cours4_Master_Nanoelectronic s_0607.pdf, 14 pages, 2004 Adrian Ionescu.
Silicon MOSFETs-Novel Materials and Alternative Concepts, 2 pages, no name/year, pp. 380-381.
Malgorzata Jurczak et al., "Silicon-on-Nothing (SON)-an Innovative Process for Advanced CMOS," IEEE Transactions on Electron Devices, vol. 47, No. 11, Nov. 2000, pp. 2179-2187.
M. Jurczak et al., "SON (Silicon on Nothing)-A New Device Architecture for the ULSI Era," 1999 Symposium on VLSI Technology Digest of Technical Papers, pp. 29-30.
Tsutomu Sato et al., "Fabrication of Silicon-on-Nothing Structure by Substrate Engineering Using the Empty-Space-in-Silicon Formation Technique," Japanese Journal of Applied Physics, vol. 43, No. 1, 2004, pp. 12-18.
Phillip E. Thompson et al., "Vertical SiGe-based silison-on-nothing (SON) technology for sub-30 nm MOS devices," Materials Science in Semiconductor Processing 8 (2005), pp. 51-57.
S. Monfray et al., "Emerging silicon-on-nothing (SON) devices technology," Solid-State Electronics 48 (2004), pp. 887-895.
G. K. Celler, "Frontiers of silicon-on-insulator," Journal of Applied Physics, vol. 93, No. 9, May 1, 2003, pp. 4955-4978.
I.Z. Mitrovic et al., "Review of SiGe HBTs on SOI," Solid-State Electronics 49 (2005), pp. 1556-1567.
Christophe Maleville et al., "Smart-Cut technology: from 300 mm ultrathin SOI production to advanced engineered substrates," Solid-State Electronics 48 (2004), pp. 1055-1063.

* cited by examiner

*Primary Examiner*—Michael Trinh

(57) ABSTRACT

One or more trenches can be formed around a first portion of a semiconductor substrate, and an insulating layer can be formed under the first portion of the semiconductor substrate. The one or more trenches and the insulating layer electrically isolate the first portion of the substrate from a second portion of the substrate. The insulating layer can be formed by forming a buried layer in the substrate, such as a silicon germanium layer in a silicon substrate. One or more first trenches through the substrate to the buried layer can be formed, and open spaces can be formed in the buried layer (such as by using an etch selective to silicon germanium over silicon). The one or more first trenches and the open spaces can optionally be filled with insulative material(s). One or more second trenches can be formed and filled to isolate the first portion of the substrate.

20 Claims, 4 Drawing Sheets

US 7,829,429 B1

SEMICONDUCTOR DEVICE HAVING LOCALIZED INSULATED BLOCK IN BULK SUBSTRATE AND RELATED METHOD

TECHNICAL FIELD

This disclosure is generally directed to semiconductor devices. More specifically, this disclosure is directed to a semiconductor device having a localized insulated block in a bulk substrate and related method.

BACKGROUND

Conventional semiconductor devices can be formed on various types of semiconductor substrates. For example, some conventional semiconductor devices can be formed using bulk silicon substrates, which generally represent blocks of silicon. As a particular example, various areas of a bulk silicon substrate can be doped and contacts can be fabricated over the bulk silicon substrate to form transistors in a semiconductor device. Other integrated circuits could also be formed in and over the bulk silicon substrate in the semiconductor device.

Other conventional semiconductor devices can be formed using silicon-on-insulator (SOI) substrates. A silicon-on-insulator substrate generally refers to a layered silicon-insulator-silicon substrate. Integrated circuits are generally formed in and over a portion of the silicon, where that portion is located above an insulator layer in the silicon-on-insulator substrate.

One specific type of silicon-on-insulator substrate is a silicon-on-nothing (SON) substrate, which generally refers to a layered silicon-nothing-silicon substrate. The "nothing" in the silicon-on-nothing substrate often represents an air pocket in the substrate. In other words, the silicon-on-nothing substrate is a type of silicon-on-insulator substrate that uses air as the insulating material. Integrated circuits are generally formed in and over a portion of the silicon, where that portion is located above the air pocket in the silicon-on-insulator substrate.

BRIEF DESCRIPTION OF THE DRAWINGS

For a more complete understanding of this disclosure and its features, reference is now made to the following description, taken in conjunction with the accompanying drawings, in which:

FIGS. 2A-1 through 2E-4 illustrate an example technique for forming a semiconductor device having a localized insulated block in a bulk substrate according to this disclosure; and FIG. 3 illustrates an example method for forming a semiconductor device having a localized insulated block in a bulk substrate according to this disclosure.

DETAILED DESCRIPTION

Figure 1:
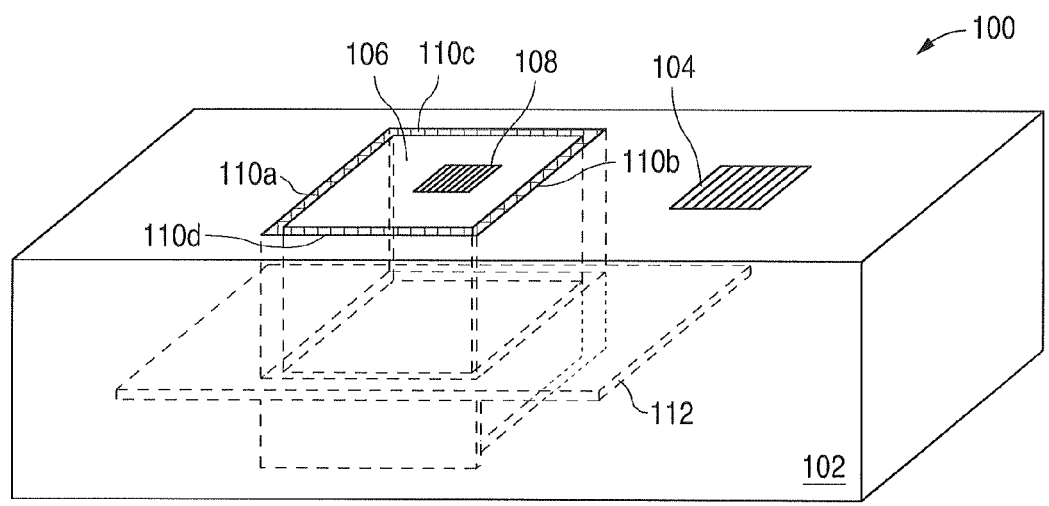
FIG. 1 illustrates an example semiconductor device having a localized insulated block in a bulk substrate according to this disclosure.
Figures 1, 2A:
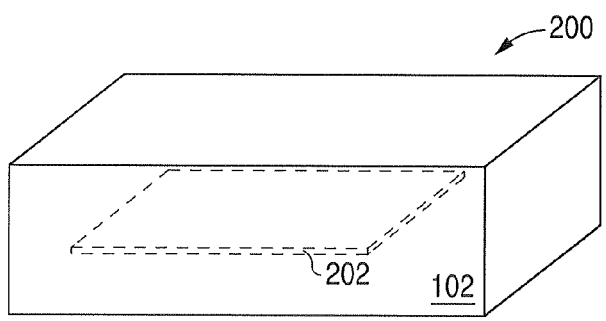
Figures 2, 2A:
Figures 2, 2A, 3:
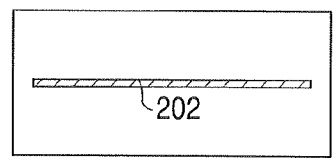

FIGS. 1 through 3, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

FIG. 1 illustrates an example semiconductor device 100 having a localized insulated block in a bulk substrate according to this disclosure. The embodiment of the semiconductor device 100 shown in FIG. 1 is for illustration only. Other embodiments of the semiconductor device 100 could be used without departing from the scope of this disclosure.

As shown in FIG. 1, the semiconductor device 100 includes a substrate 102. The substrate 102 generally represents a bulk substrate in or on which various integrated circuits 104 can be fabricated. The substrate 102 could have any suitable size, shape, and dimensions. The substrate 102 could also be formed from any suitable material(s), such as silicon. The integrated circuits 104 could represent any suitable integrated circuitry implemented on a bulk substrate. The integrated circuits 104 could, for example, include transistors, resistors, capacitors, inductors, diodes, operational amplifiers, voltage regulators, current and voltage sources, and any other or additional circuitry.

In this example, the substrate 102 includes an isolated block 106, which is electrically isolated from the remainder of the substrate 102. The isolated block 106 generally represents a portion of the substrate 102 in or on which integrated circuits 108 requiring an insulated substrate can be fabricated. The isolated block 106 could have any suitable size, shape, and dimensions. The integrated circuits 108 could represent any suitable integrated circuitry implemented on an insulated substrate. The integrated circuits 108 could, for example, include transistors, resistors, capacitors, inductors, diodes, operational amplifiers, voltage regulators, current and voltage sources, and any other or additional circuitry. In some embodiments, the isolated block 106 forms part of a silicon-on-insulator (including a silicon-on-nothing) substrate.

In this example embodiment, the isolated block 106 is isolated from the remainder of the substrate 102 by four trenches 110a-110d and an insulating layer 112. Each of the trenches 110a-110d in this example extends from an upper surface of the substrate 102 down through the insulating layer 112. Collectively, the four trenches 110a-110d encircle the isolated block 106, and the insulating layer 112 extends under the isolated block 106. As a result, the trenches 110a-110d and the insulating layer 112 completely surround the isolated block 106 (except for the top surface of the isolated block 106), which electrically isolates the isolated block 106 from the remainder of the substrate 102.

In this example, four trenches 110a-110d and a single uniform insulating layer 112 are used to isolate the isolated block 106. However, the isolated block 106 could be electrically isolated from the remainder of the substrate 102 in any other suitable manner. For example, any suitable number of trenches (one or more) could be used to encircle the isolated block 106, and one or more uniform or non-uniform insulating layers could be formed under the isolated block 106.

The trenches 110a-110d and the insulating layer 112 could contain any suitable insulating material(s) for electrically insulating the isolated block 106. For example, the trenches 110a-110d and the insulating layer 112 could be filled with an oxide or nitride material, such as an oxide or nitride material deposited using chemical vapor deposition (CVD). The trenches 110a-110d and the insulating layer 112 could also be filled with an oxide or nitride liner and a conductive material (such as polysilicon) that is separated from the isolated block 106 by the liner. The trenches 110a-110d and the insulating layer 112 could further be filled or remain exposed to air (as long as the isolated block 106 is maintained in position, such as by material in part of the trenches 110a-110d and/or insulating layer 112). Any other or additional material(s) could be used in the trenches 110a-110d and the insulating layer 112, and the same material(s) may or may not be used in the trenches 110a-110d and the insulating layer 112.

The integrated circuits 104 and 108 formed in or on the bulk substrate 102 and the isolated block 106 could be coupled together, such as by using electrical traces that travel between the integrated circuits 108 on the isolated block 106 and the integrated circuits 104 on the bulk substrate 102. In this way, integrated circuits on an SOI, SON, or other isolated substrate (isolated block 106) can be formed along side integrated circuits on a bulk substrate. As a particular example, some integrated circuits may require a bulk substrate, while other integrated circuits may require an isolated substrate. This may occur, for example, when the required or desired electrical characteristics or other characteristics of the integrated circuits vary. By isolating the block 106 from the remainder of the substrate 102, different types of integrated circuits (which may normally require different types of substrates) can be fabricated on the same substrate 102. As described in more detail below, the integrated circuits 108 formed on the isolated block 106 may be subjected to both a first trench formation (such as for trenches 110a-110b) and a second trench formation (such as for trenches 110c-110d), and an undercut etch can be used to form the insulating layer 112. The integrated circuits 104 on the bulk substrate 102 may be subjected to only the second trench formation (and no undercut etch is required for these devices). In addition, since the isolated block 106 is formed from the substrate 102, the isolated block 106 and the remainder of the substrate 102 are in crystallographical alignment.

Although FIG. 1 illustrates one example of a semiconductor device 100 having a localized insulated block 106 in a bulk substrate 102, various changes may be made to FIG. 1. For example, the block 106 can be isolated from the remainder of the substrate 102 using any suitable number of trenches, insulating layers, and/or other structures. Also, each component of the semiconductor device 100 could have any suitable size, shape, and dimensions. As a particular example, while the trenches 110a-110d are shown as having uneven depths into the substrate 102, the trenches 110a-110d could have equal or approximately equal depths.

FIGS. 2A-1 through 2E-4 illustrate an example technique for forming a semiconductor device having a localized insulated block in a bulk substrate according to this disclosure. In particular, FIGS. 2A-1 through 2E-4 illustrate an example series of steps that can be used to form the isolated block 106 in the semiconductor device 100 of FIG. 1. The fabrication technique shown in FIGS. 2A-1 through 2E-4 is for illustration only. Other techniques could be used to form the isolated block 106 in the semiconductor device 100 of FIG. 1 or to form any other suitable isolated portion in a bulk substrate in any suitable device.

FIG. 2A-1 illustrates a structural view of a structure 200 in which the isolated block 106 can be formed. FIG. 2A-2 illustrates a top view of the structure 200. FIG. 2A-3 illustrates a cross-sectional view of the structure 200 (where the cross-section is taken along a vertical plane through the center of the structure 200 and the vertical plane is generally parallel to the front surface of the structure 200 shown in FIG. 2A-1).

As shown here, the structure 200 generally includes a substrate 102 and a buried layer 202. In this example, the buried layer 202 represents a generally flat layer of material formed within the substrate 102. While this particular embodiment illustrates the buried layer 202 as being generally rectangular and planar, the buried layer 202 could have any suitable size, shape, and dimensions. Also, the buried layer 202 may or may not have a relatively consistent height. Further, the buried layer 202 could be formed from any suitable material(s), such as silicon germanium. However, the buried layer 202 could be formed from any other suitable material(s), such as any material(s) that can be selectively etched without causing an excessive etch of the substrate 102. Similarly, while described as being formed from silicon, the substrate 102 could be formed from any suitable semiconductor material(s) in which a second layer may be formed and selectively etched. In addition, the buried layer 202 could be formed in any suitable manner, such as by growing a layer of silicon germanium at a suitable depth in the substrate 102 using CVD epitaxial deposition.

Figures 1, 2B:
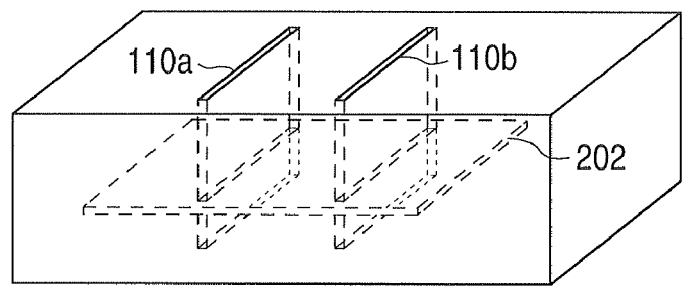
Figures 2, 2B:
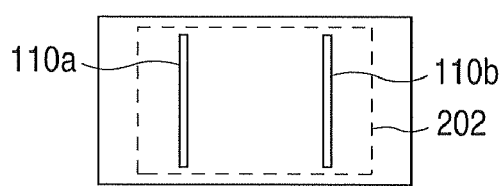
Figures 2, 2B, 3:
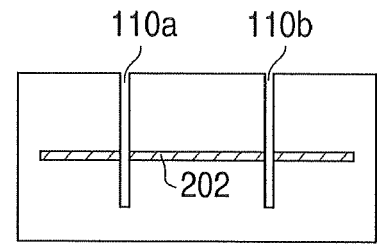

FIG. 2B-1 illustrates a structural view of the structure 200 with two trenches 110a-110b etched into the substrate 102. FIG. 2B-2 illustrates a top view of the structure 200 with the trenches 110a-110b, and FIG. 2B-3 illustrates a cross-sectional view of the structure 200 with the trenches 110a-110b. As shown here, the trenches 110a-110b are etched through the substrate 102 into the buried layer 202. In this example, the trenches 110a-110b are actually etched through the buried layer 202 into the substrate 102 below the buried layer 202 (although this need not be the case). The portion of the substrate 102 between the trenches 110a-110b may remain suspended in position by the unetched sides/ends of this portion. Any suitable distance may separate the trenches 110a-110b in the substrate 102. As a particular example, the trenches 110a-110b could be separated by a distance that allows the isolated block 106 being formed to maintain its structural integrity during and after formation. This could, for example, require that the trenches 110a-110b not be separated by an excessive distance, which could allow the isolated block 106 being formed to "sag" into an open space created in the buried layer 202 during subsequent processing steps. The trenches 110a-110b could also have any suitable length, width, and depth.

Figures 1, 2C:
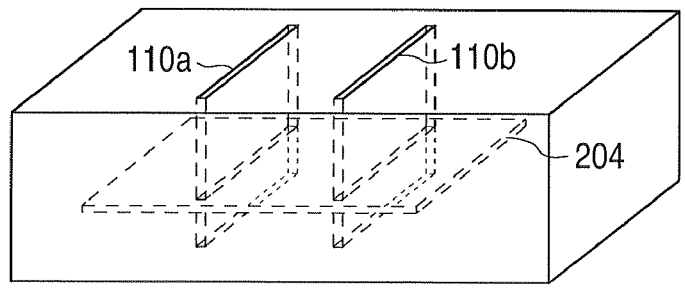
Figures 2, 2C:
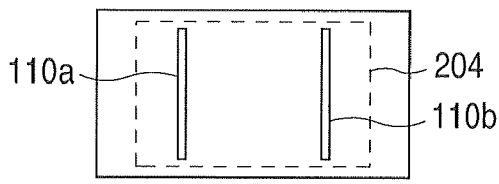
Figures 2, 2C, 3:
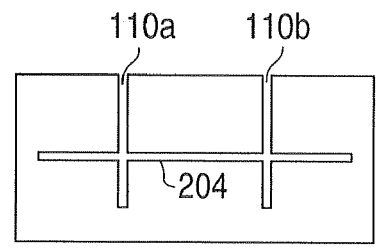

FIG. 2C-1 illustrates a structural view of the structure 200 after an open space 204 is formed within the substrate 102. FIG. 2C-2 illustrates a top view of the structure 200 with the open space 204, and FIG. 2C-3 illustrates a cross-sectional view of the structure 200 with the open space 204. The open space 204 can be formed by removing at least some of the material(s) forming the buried layer 202. For example, the open space 204 could be formed by performing a wet or dry isotropic etch that is selective to silicon germanium over silicon. This allows the buried layer 202 formed from silicon germanium to be etched while leaving the substrate 102 formed from silicon relatively unaffected. It may be noted that the etch of the buried layer 202 may or may not remove all of the silicon germanium or other material(s) forming the buried layer 202. The complete removal of material(s) from the buried layer 202 is not required as long as an adequate open space 204 forms. Any suitable etch could be used during this step, depending on (among other things) the composition of the substrate 102 and the composition of the buried layer 202.

Figures 1, 2D:
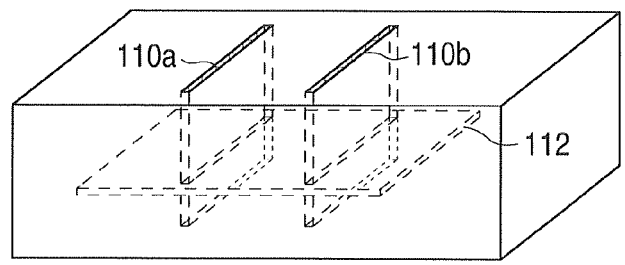
Figures 2, 2D:
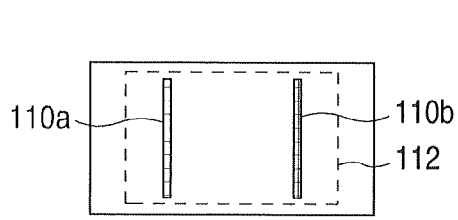
Figures 2, 2D, 3:
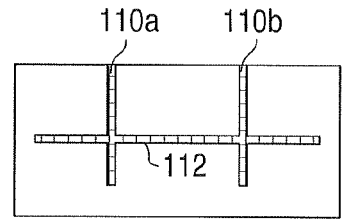

FIG. 2D-1 illustrates a structural view of the structure 200 after a deposition is performed to fill the trenches 110a-110b and the open space 204. FIG. 2D-2 illustrates a top view of the structure 200 after the deposition, and FIG. 2D-3 illustrates a cross-sectional view of the structure 200 after the deposition. In this example, the open space 204 has been filled with one or more materials to form the insulating layer 112. Also, the trenches 110a-110b have been filled with one or more materials. This begins to isolate the portion of the substrate 102 between the trenches 110a-110b from the remainder of the substrate 102. Any suitable material(s) could be used to fill the trenches 110a-110b and the open space 204, such as an oxide or a nitride. Also, any suitable technique(s)) could be used to fill the trenches 110a-110b and the open space 204, such as an underfill process that deposits material under the portion of the substrate 102 being isolated.

Figures 1, 2E:
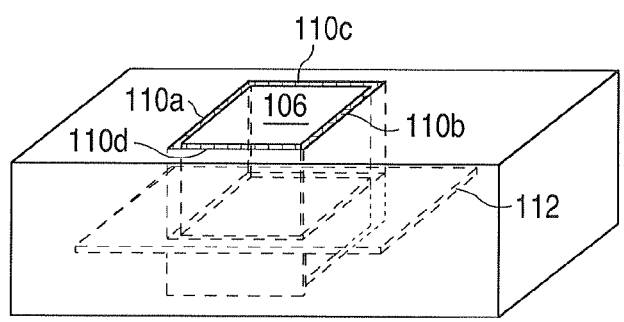
Figures 2, 2E:
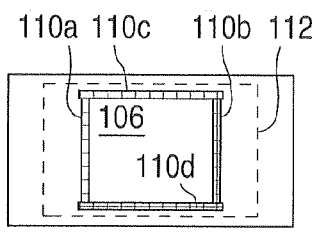
Figures 2, 2E, 3:
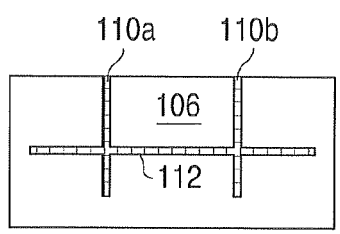
Figures 2, 2E, 3, 4:
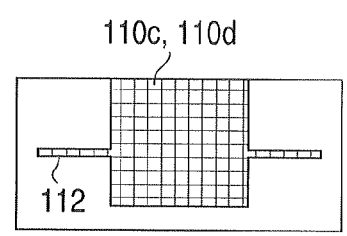
Figure 3:
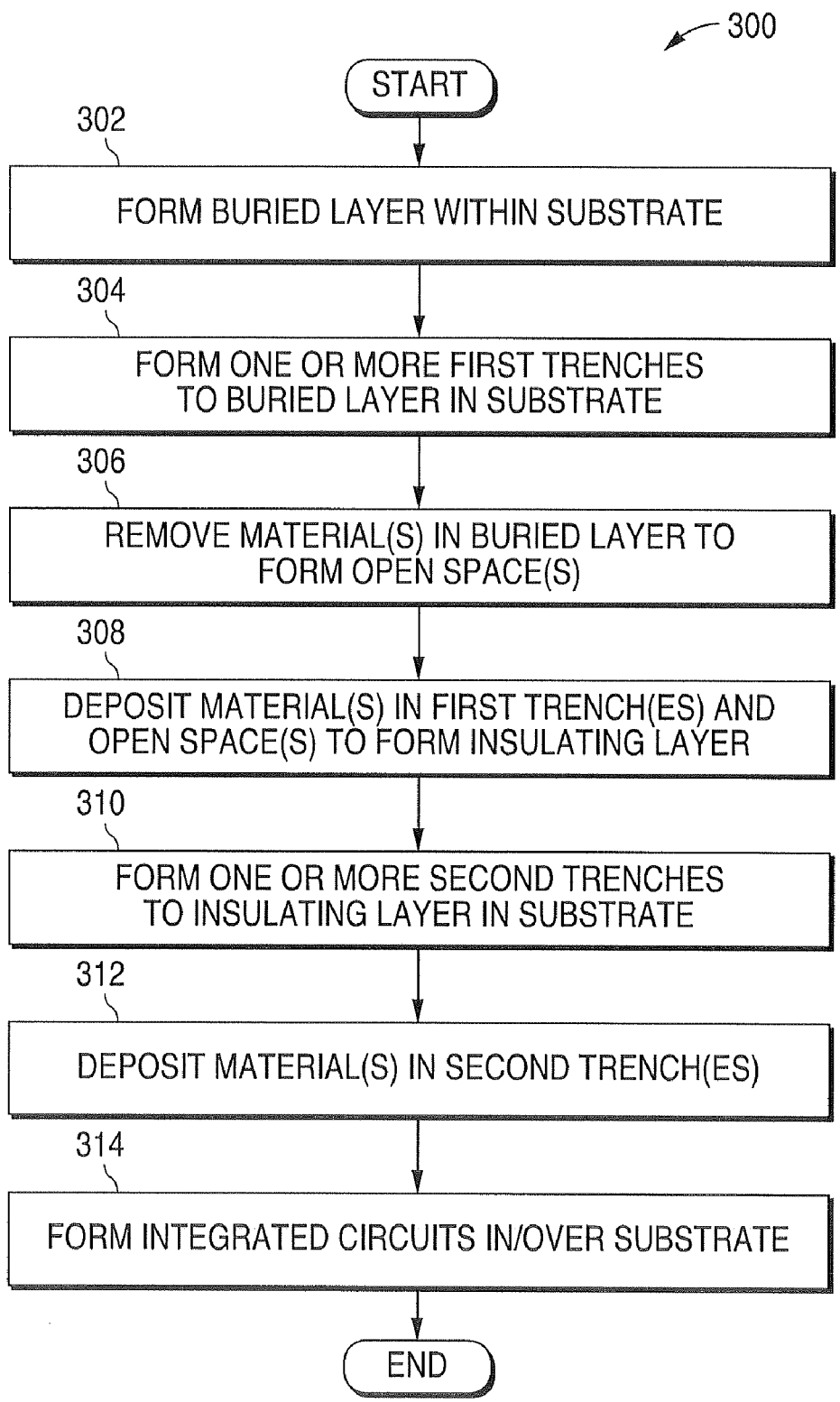

FIG. 2E-1 illustrates a structural view of the structure 200 after two more trenches 110c-110d are etched and filled with one or more materials. FIG. 2E-2 illustrates a top view of the structure 200 after the formation of the trenches 110c-110d. FIGS. 2E-3 and 2E-4 illustrate cross-sectional views of the structure 200 after the formation of the trenches 110c-110d. More specifically, FIG. 2E-3 illustrates a cross-sectional view of the structure 200 taken along the vertical plane through the center of the structure 200, and FIG. 2E-4 illustrates a cross-sectional view of the structure 200 taken along a vertical plane through one of the trenches 110c-110d.

As shown here, the trenches 110c-110d are formed by etching through the substrate 102 down to and into the insulating layer 112. In this example, the trenches 110c-110d are actually etched through the insulating layer 112 and into the substrate 102 below the buried layer 202 (although this need not be the case). Also, the trenches 110c-110d in this example are not etched as deeply as the trenches 110a-110b (although this need not be the case). The trenches 110c-110d could be filled with one or more materials, such as an oxide or a nitride. The formation of the trenches 110c-110d completes the isolation of the block 106 from the remainder of the substrate 102.

It may be noted that various departures from this technique could be done depending on particular needs. For example, the buried layer 202/insulating layer 112 is shown as having a uniform depth in the substrate 102. However, the buried layer 202/insulating layer 112 could be formed at any suitable uniform depth or non-uniform depths, and different buried layers 202/insulating layers 112 could be formed at the same depth or different depths. As a particular example, the integrated circuits 108 could include circuitry that operates using 2V and circuitry that operates using 15V. The 2V circuitry could be formed over a buried layer 202/insulating layer 112 having a 0.5 µm depth (meaning the silicon under this circuitry is 0.5 µm thick), and the 15V circuitry could be formed over a buried layer 202/insulating layer 112 having a 6 µm depth (meaning the silicon under this circuitry is 6 µm thick). As another example, the buried layer 202/insulating layer 112 could have different thicknesses, such as when the buried layer 202/insulating layer 112 is thicker under circuitry that operates using higher voltages. In addition, the buried layer 202 has been described as being completely etched to form the open space 204. However, the buried layer 202 could also be partially etched, such as partially etched to leave a portion of the buried layer 202 under the isolated block 106. This could be done, for example, to allow a portion of the silicon germanium buried layer 202 to remain between the isolated block 106 and the remainder of the substrate 102. This portion of the silicon germanium buried layer 202 could form a mechanical heat sink under the isolated block 106, which may transport heat from the isolated block 106 to the remainder of the substrate 102.

Although FIGS. 2A-1 through 2E-4 illustrate one example of a technique for forming a semiconductor device having a localized insulated block in a bulk substrate, various changes may be made to FIGS. 2A-1 through 2E-4. For example, the block 106 can be isolated from the remainder of the substrate 102 using any suitable number of trenches and insulating layers. Also, the insulating layer could be formed in any other suitable manner. In addition, each component of the structure 200 could have any suitable size, shape, and dimensions.

FIG. 3 illustrates an example method 300 for forming a semiconductor device having a localized insulated block in a bulk substrate according to this disclosure. The embodiment of the method 300 shown in FIG. 3 is for illustration only. Other embodiments of the method 300 could be used without departing from the scope of this disclosure.

A buried layer is formed in a semiconductor substrate at step 302. This could include, for example, growing a silicon germanium buried layer 202 in a silicon substrate 102. The silicon germanium buried layer 202 could be formed in the silicon substrate 102 in any suitable manner, such as by using CVD epitaxial deposition. Also, other or additional material(s) could be used to form the buried layer 202, and the buried layer 202 could be formed in any suitable manner and in any suitable type of substrate 102.

One or more first trenches are formed in the substrate at step 304. The one or more first trenches could be formed in any suitable manner, such as by masking the substrate 102 to expose the appropriate areas and performing a dry or wet etch to form the trenches 110a-110b. The one or more first trenches extend through the substrate 102 to the buried layer 202. The one or more first trenches could optionally extend beyond the buried layer 202, such as by etching through the buried layer 202 and continuing to etch into the underlying substrate 102. The first trenches may or may not have the same depth as each other.

One or more materials in the buried layer are removed to form open space at step 306. This could include, for example, performing a wet or dry isotropic etch that is more selective to silicon germanium in the buried layer 202 than to silicon in the substrate 102. This step could include completely or partially removing the material(s) in the buried layer 202 to form one or more open spaces 204.

One or more materials are deposited in the first trench(es) and the open space(s) to form an insulating layer at step 308. This could include, for example, performing an underfill process that deposits material under the portion of the substrate 102 being isolated to form the insulating layer 112. As particular examples, this could include performing chemical vapor deposition to deposit an oxide or a nitride in the trenches 110a-110b and the one or more open spaces 204. This could also include depositing an oxide or nitride liner and then depositing polysilicon in the trenches 110a-110b and the one or more open spaces 204. Any suitable material(s) could be depositing using any suitable technique(s) in this step. This step could also be partially or completely omitted, such as when the one or more first trenches and/or the one or more open spaces contain air as an isolating material.

One or more second trenches are formed in the substrate at step 310. The one or more second trenches could be formed in any suitable manner, such as by masking the substrate 102 to expose the appropriate areas and performing a dry or wet etch to form the trenches 110c-110d. The one or more second trenches extend through the substrate 102 to the insulating layer 112. The one or more second trenches could optionally extend below the insulating layer 112, such as by etching through the insulating layer 112 and continuing to etch into the underlying substrate 102. The second trenches may or may not have the same depth as each other and/or the first trench(es).

One or more materials are deposited in the second trench (es) to isolate a portion of the semiconductor substrate at step 312. This could include, for example, depositing an oxide, a nitride, or any other or additional material(s) in the one or more second trenches. Any suitable material(s) could be deposited using any suitable technique(s) in this step. This step could also be partially or completely omitted, such as when the one or more second trenches contain air as an isolating material.

Integrated circuitry is formed in and over the substrate at step 314. This could include, for example, forming integrated circuits 104 in and on the bulk substrate 102 and integrated circuits 108 in and on the isolated block 106. The integrated circuits 104 and 108 could be formed using the same fabrication steps, such as masking, implantation, and etching steps. This step could also include forming traces or other connections between the integrated circuits 104 and 108.

Although FIG. 3 illustrates one example of a method 300 for forming a semiconductor device having a localized insulated block in a bulk substrate, various changes may be made to FIG. 3. For example, while shown as a series of steps, various steps in FIG. 3 could overlap, occur in parallel, occur in a different order, or occur multiple times. Also, any suitable material(s) can be used in each of the steps, and any suitable technique(s) could be used in each step. As a particular example, different materials could be used to fill the trenches and the insulating layer.

It may be advantageous to set forth definitions of certain words and phrases that have been used within this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
    electrically isolating a first portion of a semiconductor substrate from a second portion of the semiconductor substrate;
    forming one or more first integrated circuits over the first portion of the semiconductor substrate; and
    forming one or more second integrated circuits over the second portion of the semiconductor substrate;
    wherein electrically isolating the first portion of the semiconductor substrate from the second portion of the semiconductor substrate comprises forming an insulating layer in the semiconductor substrate by:
        removing a first portion of a buried layer in the semiconductor substrate to form one or more open spaces, wherein a second portion of the buried layer remains; and
        depositing one or more insulating materials in the one or more open spaces;
    wherein at least one of the one or more first integrated circuits are formed over the remaining second portion of the buried layer; and
    wherein the remaining second portion of the buried layer forms a heat sink between the first and second portions of the semiconductor substrate.

2. The method of claim 1, wherein electrically isolating the first portion of the semiconductor substrate from the second portion of the semiconductor substrate comprises:
    forming one or more trenches around the first portion of the semiconductor substrate; and
    forming the insulating layer under the first portion of the semiconductor substrate.

3. The method of claim 2, wherein forming the one or more trenches comprises:
    forming one or more first trenches through the semiconductor substrate to the buried layer in the semiconductor substrate; and
    forming one or more second trenches through the semiconductor substrate to the buried layer in the semiconductor substrate.

4. The method of claim 1, wherein the one or more insulating materials comprise at least one of an oxide and a nitride deposited using chemical vapor deposition.

5. The method of claim 3, wherein the first portion of the buried layer is removed and the one or more insulating materials are deposited after formation of the one or more first trenches and before formation of the one or more second trenches.

6. The method of claim 3, further comprising:
    at least partially filling the one or more first trenches; and
    at least partially filling the one or more second trenches.

7. The method of claim 1, wherein:
    the buried layer comprises silicon germanium;
    the semiconductor substrate comprises silicon.

8. The method of claim 7, wherein removing the first portion of the buried layer comprises performing an isotropic etch that is selective to silicon germanium over silicon.

9. The method of claim 3, wherein:
    forming the one or more first trenches comprises forming the one or more first trenches through the buried layer to a first depth in the semiconductor substrate; and
    forming the one or more second trenches comprises forming the one or more second trenches through the buried layer to a second depth in the semiconductor substrate, the second depth deeper than the first depth.

10. A semiconductor device comprising:
    a semiconductor substrate comprising a first portion electrically isolated from a second portion;
    one or more first integrated circuits over the first portion of the semiconductor substrate; and
    one or more second integrated circuits over the second portion of the semiconductor substrate;
    wherein the first portion of the semiconductor substrate is electrically isolated from the second portion of the semiconductor substrate by an insulating layer that includes:
        a portion of a buried layer; and
        one or more insulating materials deposited in etched areas of the buried layer;
    wherein at least one of the one or more first integrated circuits is located over the portion of the buried layer; and
    wherein the portion of the buried layer forms a heat sink between the first and second portions of the semiconductor substrate.

11. The semiconductor device of claim 10, wherein the semiconductor substrate comprises:
    one or more trenches around the first portion of the semiconductor substrate; and
    the insulating layer under the first portion of the semiconductor substrate.

12. The semiconductor device of claim 11, wherein the one or more trenches comprise:
    one or more first trenches through the insulating layer to a first depth in the semiconductor substrate; and
    one or more second trenches through the insulating layer to a second depth in the semiconductor substrate, the second depth deeper than the first depth.

13. The semiconductor device of claim 11, wherein the one or more trenches are at least partially filled with one or more materials.

14. The semiconductor device of claim 10, wherein the one or more insulating materials comprise at least one of: an oxide, a nitride, and polysilicon.

15. The semiconductor device of claim 10, wherein:
the portion of the buried layer comprises silicon germanium;
the semiconductor substrate comprises silicon.

16. A method comprising:
electrically isolating a first portion of a semiconductor substrate from a second portion of the semiconductor substrate by forming an insulating layer in the semiconductor substrate, the insulating layer formed by:
forming one or more trenches around the first portion of the semiconductor substrate;
removing a first portion of a buried layer under the first portion of the semiconductor substrate to form one or more open spaces, wherein a second portion of the buried layer remains between the first and second portions of the semiconductor substrate; and
depositing one or more insulating materials in the one or more open spaces; and
forming at least one integrated circuit over the first portion of the semiconductor substrate and over the remaining second portion of the buried layer;
wherein the remaining second portion of the buried layer forms a heat sink between the first and second portions of the semiconductor substrate.

17. The method of claim 16, further comprising:
forming one or more additional integrated circuits over the second portion of the semiconductor substrate.

18. The method of claim 16, wherein forming the one or more trenches comprises:
forming one or more first trenches through the semiconductor substrate to the buried layer in the semiconductor substrate; and
forming one or more second trenches through the semiconductor substrate to the buried layer in the semiconductor substrate;
wherein the first portion of the buried layer is removed and the one or more insulating materials are deposited after formation of the one or more first trenches and before formation of the one or more second trenches.

19. The method of claim 18, wherein:
forming the one or more first trenches comprises forming the one or more first trenches through the buried layer to a first depth in the semiconductor substrate; and
forming the one or more second trenches comprises forming the one or more second trenches through the buried layer to a second depth in the semiconductor substrate, the second depth deeper than the first depth.

20. The method of claim 16, wherein:
the one or more insulating materials comprise at least one of an oxide and a nitride deposited using chemical vapor deposition;
the buried layer comprises silicon germanium;
the semiconductor substrate comprises silicon; and
removing the first portion of the buried layer comprises performing an isotropic etch that is selective to silicon germanium over silicon.

* * * * *